(12) United States Patent
Bagnati

(10) Patent No.: US 12,188,991 B2
(45) Date of Patent: Jan. 7, 2025

(54) DEVICE WITH FAULT DETECTION AND RELATED SYSTEM AND METHOD

(71) Applicant: STMICROELECTRONICS S.r.l., Agrate Brianza (IT)

(72) Inventor: Gaudenzia Bagnati, Pogliano Milanese (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 277 days.

(21) Appl. No.: 17/678,953

(22) Filed: Feb. 23, 2022

(65) Prior Publication Data

US 2023/0266403 A1    Aug. 24, 2023

(51) Int. Cl.
G01R 31/52 (2020.01)
H03K 5/24 (2006.01)
H03K 17/08 (2006.01)

(52) U.S. Cl.
CPC ........... *G01R 31/52* (2020.01); *H03K 5/24* (2013.01); *H03K 17/08* (2013.01)

(58) Field of Classification Search
CPC .......... G01R 31/52; H03K 5/24; H03K 17/08; H03K 17/18
See application file for complete search history.

(56) References Cited

U.S. PATENT DOCUMENTS

| | | | |
|---|---|---|---|
| 4,875,448 A | 10/1989 | Dykstra | |
| 4,913,557 A | 4/1990 | Segawa et al. | |
| 4,932,381 A | 6/1990 | Rousseau et al. | |
| 5,289,054 A * | 2/1994 | Lucas | H03K 5/2481 327/63 |
| 5,469,094 A | 11/1995 | Nessi | |
| 6,348,820 B1 | 2/2002 | Bennett et al. | |
| 6,664,802 B2 | 12/2003 | Wimmer et al. | |
| 9,336,704 B2 | 5/2016 | Li et al. | |
| 9,676,357 B2 * | 6/2017 | Dittfeld | B60R 21/0173 |
| 9,871,448 B2 | 1/2018 | Yan | |
| 10,340,908 B2 | 7/2019 | Baik et al. | |
| 10,910,823 B2 * | 2/2021 | Minagawa | H03K 17/0828 |
| 2004/0026997 A1 * | 2/2004 | Kim | B60Q 11/00 307/9.1 |
| 2004/0227561 A1 | 11/2004 | Balakrishnan | |
| 2009/0195190 A1 | 8/2009 | Fong et al. | |
| 2014/0184185 A1 | 7/2014 | Torrisi et al. | |
| 2018/0316182 A1 * | 11/2018 | Minagawa | H03K 17/0828 |
| 2023/0266381 A1 | 8/2023 | Bagnati et al. | |
| 2023/0266382 A1 | 8/2023 | Bagnati et al. | |

OTHER PUBLICATIONS

U.S. Appl. No. 17/678,772, filed Feb. 23, 2022.
U.S. Appl. No. 17/678,763, filed Feb. 23, 2022.
Mouser Electronics Data Sheet, ST Life Augmented, Aug. 6, 2020, pp. 20-21 and 60-61 (62 pages).

* cited by examiner

Primary Examiner — Akm Zakaria
(74) Attorney, Agent, or Firm — Seed IP Law Group LLP

(57) ABSTRACT

A device includes a driver circuit and diagnostic circuitry coupled to the driver circuit. The diagnostic circuitry includes an on-state diagnostic circuit and an off-state diagnostic circuit. The diagnostic circuitry, in operation: generates a configuration signal associated with an operative condition of the driver circuit based on a comparator output of the off-state diagnostic circuit; diagnoses conditions associated with the driver circuit; and controls operation of the on-state diagnostic circuit based on the configuration signal.

20 Claims, 10 Drawing Sheets

48

| SWITCH | STATE WHEN CFG=0 (LS) | STATE WHEN CFG=1 (HS) |
|---|---|---|
| 440/540 | ON | ON |
| 442/542 | ON | OFF |
| 444/544 | OFF | ON |
| 446/546 | OFF | ON |
| 548 | OFF | OFF |

DEVICE WITH FAULT DETECTION AND RELATED SYSTEM AND METHOD

BACKGROUND

Technical Field

The present disclosure is related to integrated circuits, and more particularly, to fault detection of integrated circuits.

Description of the Related Art

Configurable drivers for high-side/low-side integrated power may perform actuation of a power MOSFET (metal-oxide-semiconductor field-effect transistor) and detect possible fault conditions thereof. For example, an automotive driver provides, among its features, on-state overcurrent diagnosis and off-state diagnostics.

Overcurrent detection, which may always be active when the drivers are powered on, is meant to identify if load current overcomes an upper threshold dangerous to device integrity. When an overcurrent fault is set, the power MOSFET is switched off promptly in order to avoid damage resulting from self-heating.

Off-state diagnosis identifies an open load fault or a short fault (e.g., to battery or ground).

BRIEF SUMMARY

In an embodiment, a device includes a driver circuit and diagnostic circuitry coupled to the driver circuit. The diagnostic circuitry includes an on-state diagnostic circuit and an off-state diagnostic circuit. The diagnostic circuitry, in operation: generates a configuration signal associated with an operative condition of the driver circuit based on a comparator output of the off-state diagnostic circuit; diagnoses conditions associated with the driver circuit; and controls operation of the on-state diagnostic circuit based on the configuration signal.

In an embodiment, a system includes a microcontroller unit, a system basis chip, and a device coupled to the microcontroller unit and the system basis chip. The device includes a driver circuit and diagnostic circuitry. The diagnostic circuitry includes on-state diagnostic circuitry and off-state diagnostic circuitry. The diagnostic circuitry, in operation: generates a configuration signal associated with an operative condition of the driver circuit based on a comparator output of the off-state diagnostic circuitry; diagnoses conditions associated with the driver circuit; and controls operation of the on-state diagnostic circuitry based on the configuration signal.

In an embodiment, a method includes: generating a configuration signal associated with an operative condition of a driver circuit based on a comparator output of off-state diagnostic circuitry, the off-state diagnostic circuitry being coupled to the driver circuit; diagnosing conditions associated with the driver circuit; and controlling operation of on-state diagnostic circuitry coupled to the driver circuit, the controlling being based on the configuration signal.

BRIEF DESCRIPTION OF THE SEVERAL VIEWS OF THE DRAWINGS

Reference will now be made by way of example only to the accompanying drawings. In the drawings, identical reference numbers identify similar elements or acts, and reference numbers identical but for a different suffix identify similar elements or acts, unless the context indicates otherwise. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." The terms "first," "second," and similar indicators of sequence are to be construed as interchangeable unless the context indicates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. The particular features, structures, or characteristics may be combined in any suitable manner in one or more embodiments.

As used in this specification and the appended claims, the singular forms "a," "an," and "the" include plural referents unless the content indicates otherwise. It should also be noted that the term "or" is generally employed in its broadest sense, that is as meaning "and/or" unless the content indicates otherwise.

Figure 1:
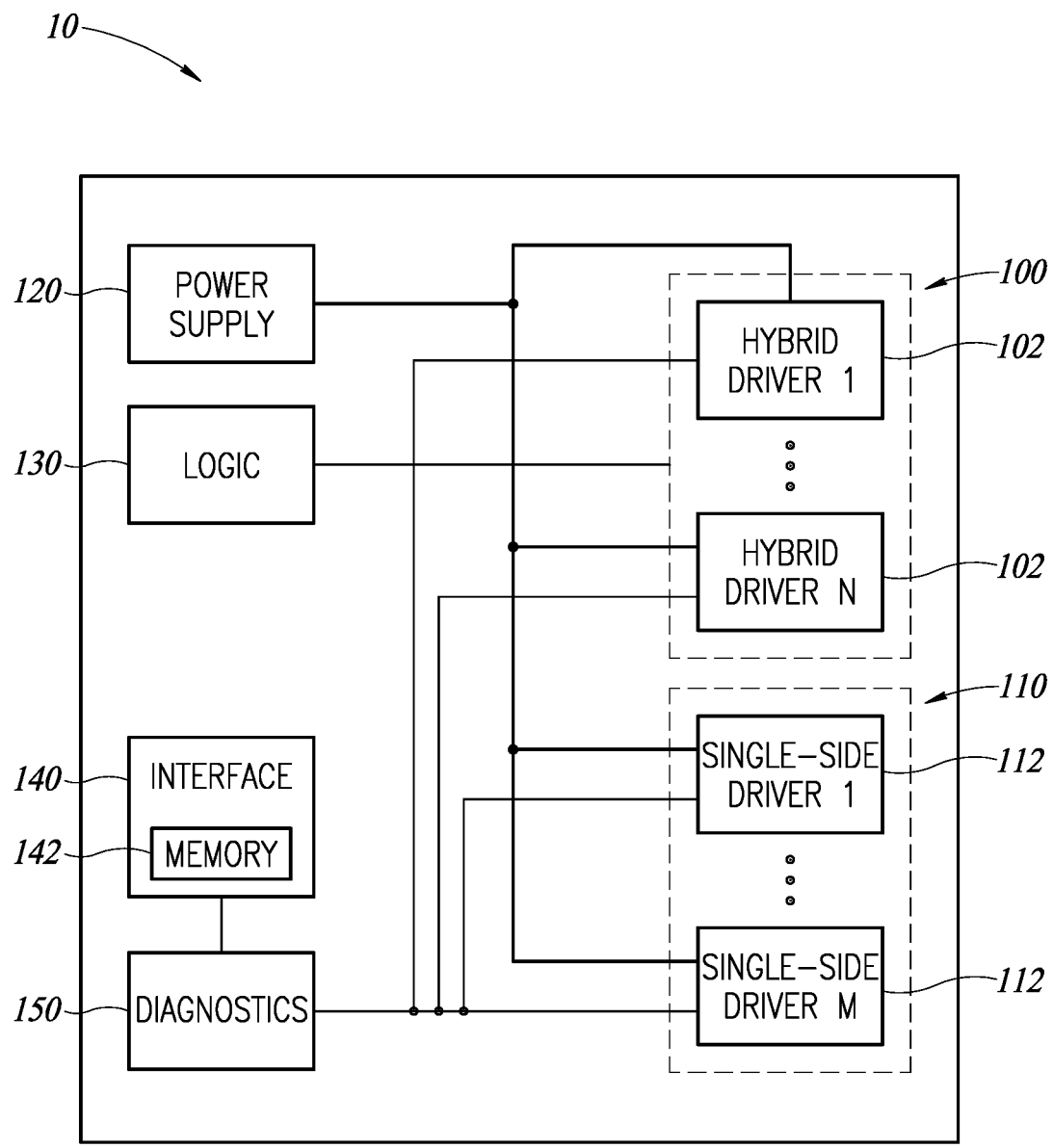
FIG. 1 is a schematic diagram of a device including diagnostic circuitry in accordance with various embodiments.

FIG. 1 is a schematic diagram of a device 10 including diagnostic circuitry 150 in accordance with various embodiments. The device 10 may be a driver integrated circuit (IC), such as a configurable driver IC for automotive applications. The device 10 includes a first bank 100 of one or more hybrid drivers 102. The device 10 includes a second bank 110 of one or more single-side drivers 112. The device 10 includes a power supply 120, logic circuitry 130, an interface 140, and diagnostic circuitry 150. The hybrid drivers 102 and the single-side drivers 112 may be referred to collectively as the drivers 102, 112.

The hybrid drivers 102 are driver circuits that may be coupled to a load in a high-side configuration or a low-side configuration. Descriptions of example high-side and low-side configurations are provided with reference to FIGS. 2A and 2B. Each of the hybrid drivers 102 is coupled to the power supply 120, and may receive or be biased or powered by a voltage supplied by the power supply 120. Each of the hybrid drivers 102 is coupled to the diagnostic circuitry 150, such that the diagnostic circuitry 150 may detect operative conditions of the hybrid drivers 102 and faults, when present, of the hybrid drivers 102.

The single-side drivers 112 are driver circuits that may be coupled to a load in only one of the high-side configuration or the low-side configuration. In some embodiments, the single-side drivers 112 are high-side driver circuits, and may not be coupled to a load in the low-side configuration. In some embodiments, one or more of the single-side drivers 112 are low-side driver circuits, and may not be coupled to a load in the high-side configuration. The single-side drivers 112 are coupled to the power supply 120, and may receive or be biased or powered by a voltage supplied by the power supply 120. The single-side drivers 112 are coupled to the diagnostic circuitry 150, such that the diagnostic circuitry 150 may detect operative condition of the single-side drivers 112 and faults, when present, of the single-side drivers 112.

The power supply 120 may be a battery. In some embodiments, the power supply 120 includes one or more voltage regulators coupled to an external power source, such as a battery of a system including the device 10, an alternating current (AC) power source (e.g., mains power), or other suitable power source. The power supply 120 may be coupled to the drivers 102, 112, the logic circuitry 130, the interface circuitry 140, the diagnostic circuitry 150, or a combination thereof.

The logic circuitry 130 may receive input signals from an external device, such as a microcontroller unit (MCU; or simply, "microcontroller"). The logic circuitry 130 may be coupled to one or more of the hybrid drivers 102, such that the input signals may be used to control operation of the respective hybrid driver 102. The logic circuitry 130 may receive an operating state signal, and may control the device 10 to enter one or more operating modes based on one or more of the operating state signal and the input signals. For example, the logic circuitry 130 may control the device 10 to enter a sleep mode, a fail-safe mode, or both based on the operating state signal and the input signals. Description of the operating modes of the device 10 is provided with reference to FIG. 5.

The interface 140 may be used to configure the device 10, control outputs of the device 10 (e.g., outputs of the hybrid and single-side drivers 102, 112), and read diagnostic and status registers. The interface 140 may include memory circuitry 142 (or simply, "memory 142"). In some embodiments, the interface 140 is a serial peripheral interface (SPI). The interface 140 may be one or more of a full-duplex interface, a synchronous interface, a serial interface, an out-of-frame interface, a slave interface or various combinations thereof. In "in-frame" interfaces, data of a slave response may coincide with or be in the same time slot (or frame) that a request from a master is in. In an "out-of-frame" interface, the slave response is generally in another frame following the frame in which the request from the master was present. In some embodiments, the interface 140 is coupled to the diagnostic circuitry 150. In some embodiments, the interface 140 provides diagnosis information about the device 10 and status of loads coupled to the hybrid and single-side drivers 102, 112. Diagnosis information associated with each channel (e.g., each driver 102, 112) may be independent of other channels. A faulty condition on one channel may have no influence on the diagnostic of other channels in the device 10.

The diagnostic circuitry 150 provides information about faulty conditions of the drivers 102, 112. The faulty conditions may include an over temperature fault, an open load fault, a short fault, an overcurrent fault, other faults, or a combination thereof. In some embodiments, the diagnostic circuitry 150 includes on-state diagnostic circuitry and off-state diagnostic circuitry.

The on-state diagnostic circuitry may detect the overcurrent fault while the device 10 is in the active operating mode. Overcurrent detection is active when the device 10 is powered and active, and detects if current through the load overcomes an upper threshold associated with device integrity. Upon detection of overcurrent, the logic circuitry 130 switches off the power to avoid damage resulting from self-heating.

The off-state diagnostic circuitry detect occurrence of an open load fault or a short fault (e.g., to battery in high-side configuration or to ground in low-side configuration). One less area-consuming approach to perform off-state diagnosis is to connect a low voltage comparator with fixed voltage threshold to a node of interest (e.g., a source terminal or a drain terminal) and to activate a pull-up and a pull-down current on the node in two different phases. The type of fault (e.g., open load or short) may be derived from output state of the comparator at the end of two temporal windows (e.g., a pull-up window and a pull-down window).

In some embodiments, each hybrid driver 102 is associated with on-state diagnostic circuitry and off-state diagnostic circuitry for both configurations (e.g, high-side and low-side), so as to sense the source voltage in high-side configuration and the drain voltage in low-side configuration separately. This results in four distinct analog circuits per hybrid driver 102. In some embodiments, to save silicon area, a single circuit architecture may be shared for high-side and low-side configured channels, resulting in two analog circuits overall.

Sharing on-state and off-state diagnostic circuitry in a hybrid driver 102 involves communicating to the diagnostic circuitry 150 information about configuration of the hybrid driver 102. When the hybrid driver 102 is high-side configured, the diagnostic circuitry 150 senses the source node. When the hybrid driver 102 is low-side configured, the diagnostic circuitry 150 senses the drain node. Sequencing of temporal windows of the off-state diagnosis and the way to encode comparator outputs in the correct registers depends on configuration of the channel of the hybrid driver 102. Incoherence or mismatch between hardware structure and configuration signal may result in a spurious fault that prevents the channel of the hybrid driver 102 from turning on or prevents an effective failure from being detected.

In some embodiments, configuration of the hybrid drivers 102 may be stored in a register. For example, one approach to configuring the hybrid driver 102 includes use of a dedicated SPI register of the interface 140, which may be filled by a user according to the type of load connected to each hybrid driver 102. For example, a configuration register may store a number of bits corresponding to number of the hybrid drivers 102, such as six bits corresponding to six respective hybrid drivers 102. Each bit may have value "0" or "1," indicating whether the respective hybrid driver 102 is high-side configured (e.g., "1") or low-side configured (e.g., "0").

Storing configuration information of the hybrid drivers 102 in a register of the interface 140 may result in a false fault detection that occurs when the device 10 is transitioned to operate in the fail-safe operating mode. In this condition, one or more of the hybrid drivers 102 continues to drive their respective loads even if digital supply voltage is not available. As such, SPI communication may be possible, but only in read-only mode (SPI registers can be read but cannot be written). The fail-safe operating mode may be entered from a Sleep/Reset state, which means that registers are set to default values. In the case of the configuration register, the default value of the stored bits may be "0x00," corresponding to all hybrid drivers 102 being low-side configured. While the device 10 operates in the fail-safe operating mode, the stored bits cannot be written to the correct values that match the actual configuration of the hybrid drivers 102.

In this scenario in which the stored bits indicate that all hybrid drivers 102 are low-side configured, if a hybrid driver 102 is high-side configured, and receives the wrong configuration signal, the overcurrent detection performed by the on-state diagnostic circuitry may sense voltage on the drain terminal instead of the source terminal. When a gate terminal of the hybrid driver 102 exits a plateau phase and the on-state diagnostic circuitry is enabled, the hybrid driver 102 may be switched off due to voltage at the drain terminal (e.g., battery voltage) being greater than a sense voltage. As such, the hybrid driver 102 is switched off for a false overcurrent fault.

The inventors have realized that a comparator output of the off-state diagnostic circuitry may be employed to facilitate identification of a high-side or a low-side configuration of the hybrid driver 102 in any operative condition, for example, an inverted comparator output of the off-state diagnostic circuitry may be used as a configuration signal CFG through a closed loop approach.

Figure 2A:
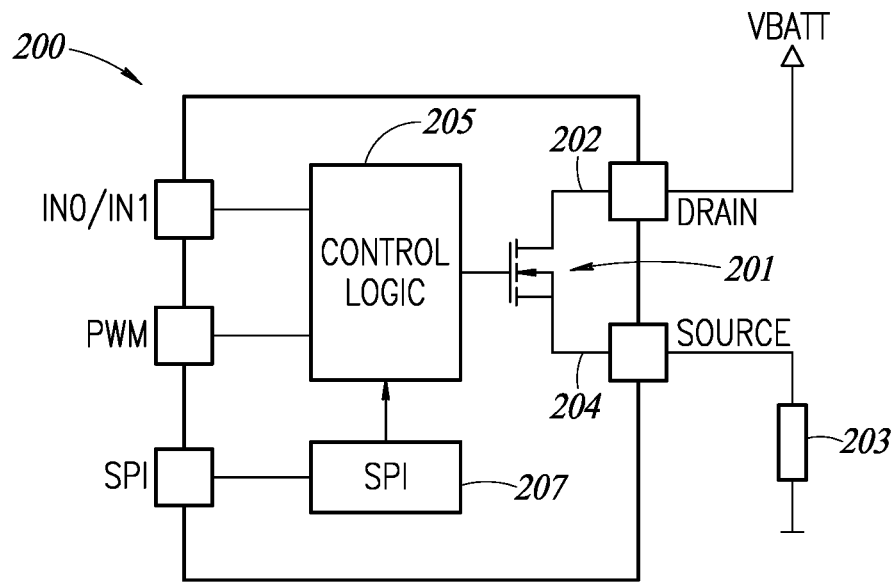
FIGS. 2A and 2B are schematic diagrams of hybrid drivers in high-side configuration and low-side configuration in accordance with various embodiments.
Figure 2B:
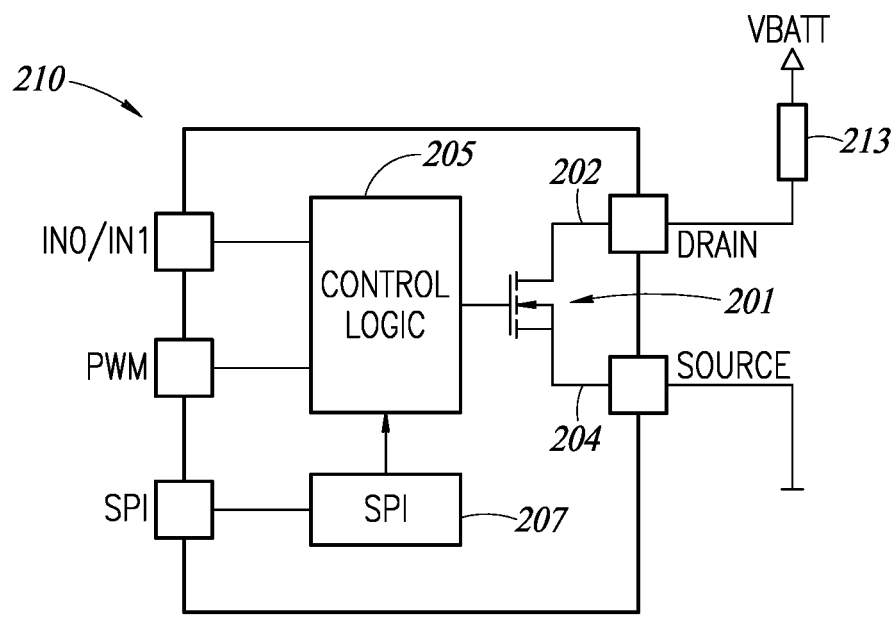

FIGS. 2A and 2B are schematic diagrams of hybrid drivers 200, 210 in high-side configuration and low-side configuration, respectively, in accordance with various embodiments. The hybrid drivers 200, 210 may be used as the hybrid drivers 102 of FIG. 1. Description of the hybrid driver 200 is applicable to the hybrid driver 210 in many respects.

In FIG. 2A, the hybrid driver 200 is in the high-side configuration, and includes a transistor 201, which may be a metal-oxide-semiconductor (MOS) transistor. The hybrid driver 200 includes control logic circuitry 205, and interface circuitry 207. The hybrid driver 200 is coupled to a load 203.

The control logic circuitry 205 is coupled to a gate terminal of the transistor 201. Voltage outputted by the control logic circuitry 205 to the gate terminal of the transistor 201 controls output current (e.g., drain-source current IDs) of the transistor 201. In some embodiments, the control logic circuitry 205 is pulse width modulation (PWM) control circuitry. In such embodiments, output power of the transistor 201 into the load 203 may be controlled by outputting the voltage of the control logic circuitry 205 as a square wave having controllable duty cycle and frequency. The duty cycle, frequency, or both may be received by the control logic circuitry 205 from the interface circuitry 207. The control logic circuitry 205 may receive a PWM signal PWM from a PWM generator internal to the device 10 instead of, or in addition to, from the interface circuitry 207. The control logic circuitry 205 may receive one or more input signals IN0, IN1 different from the PWM signal PWM.

The interface circuitry 207 may be SPI circuitry, and may be included in the interface circuitry 140 of FIG. 1. The interface circuitry 207 is coupled to the control logic circuitry 205, and may supply information about duty cycle, frequency, voltage level, or a combination thereof to the control logic circuitry 205. The interface circuitry 207 may receive an interface signal SPI from interface circuitry external to the hybrid driver 200, such as the interface circuitry 140 of FIG. 1.

In the high-side configuration shown in FIG. 2A, the load 203 is coupled to the source terminal 204 of the transistor 201. In some embodiments, the load 203 is coupled to a ground terminal. The ground terminal may be a negative terminal of a battery, a common ground of the device 10, or other suitable terminal.

In FIG. 2B, the hybrid driver 210 is configured in the low-side configuration. The hybrid driver 210 configured in the low-side configuration is coupled to a load 213. The load 213 is coupled to a drain terminal 202 of the transistor 201 and to a power supply node. The power supply node may be a terminal of a battery, and may have a battery voltage VBATT. The battery voltage may be in a range of about 6 Volts to about 18 Volts, though other battery voltages above or below the range may also be used, such as 48 Volts, 5 Volts, or another battery voltage.

Figure 3A:
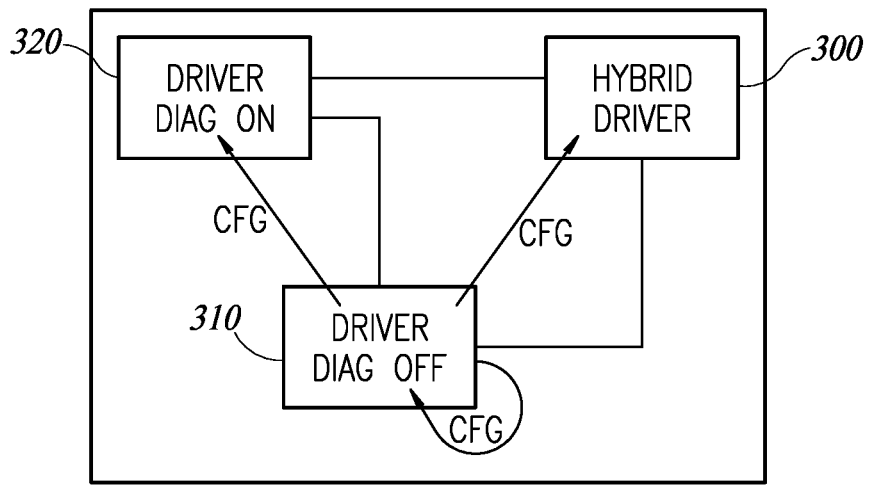
FIGS. 3A and 3B are schematic diagrams of diagnostic circuitry coupled to a hybrid driver in accordance with various embodiments.
Figure 3B:
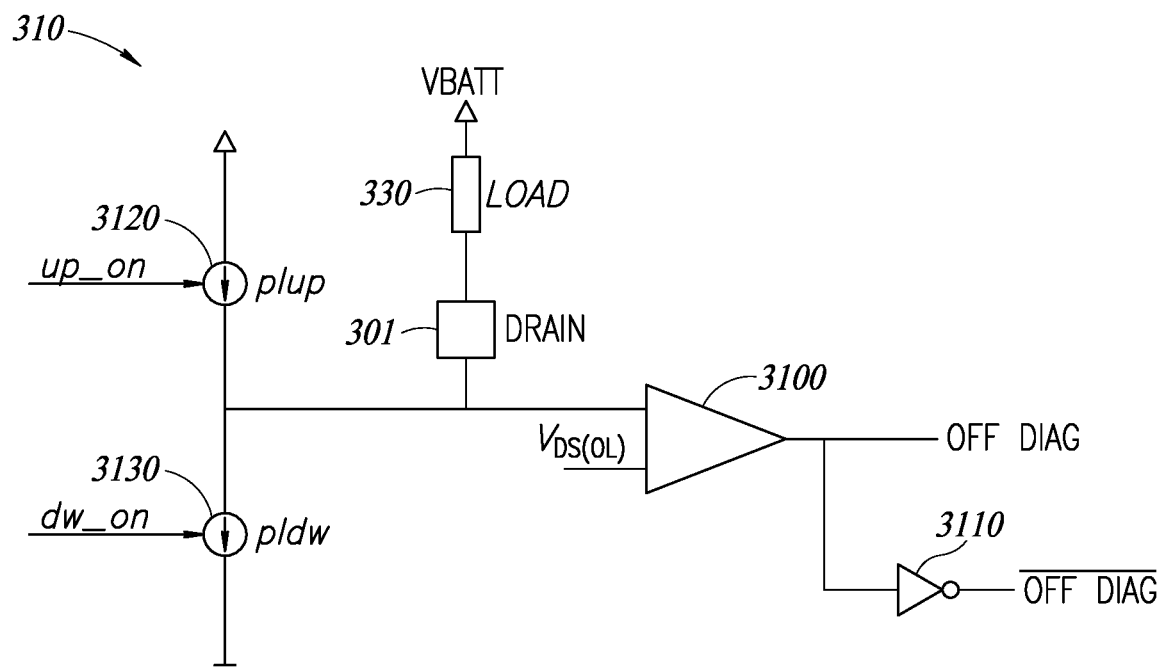

FIGS. 3A and 3B are schematic diagrams of diagnostic circuitry 310, 320 coupled to a hybrid driver 300 in accordance with various embodiments. FIG. 3A illustrates conceptually generation of the configuration signal CFG by off-state diagnostic circuitry 310, and input of the configuration signal CFG to on-state diagnostic circuitry 320 and the hybrid driver 300. Instead of, or in addition to, storing information about configuration of the hybrid driver 300 in a register of an interface (e.g., in the memory circuitry 142 of the interface 140), the off-state diagnostic circuitry 310 generates the configuration signal CFG by a closed-loop process, as illustrated conceptually in FIG. 3A. The configuration signal CFG generated by the off-state diagnostic circuitry 310 may be referred to as a self-generated configuration signal CFG or an autoconfiguration signal CFG. An example of the generation of the configuration signal CFG is described in detail with reference to FIGS. 6A-6C.

FIG. 3B is a schematic diagram of the off-state diagnostic circuitry 310 in accordance with various embodiments. The off-state diagnostic circuitry 310 may be coupled to a load 330 that is itself coupled to the hybrid driver 300. In the embodiment shown in FIG. 3B, the load 330 is coupled to a power supply node, such as a battery terminal that supplies a battery voltage VBATT. As such, the hybrid driver 300 coupled to the load 330 is configured in low-side configuration, and the off-state diagnostic circuitry 310 may be coupled to a drain terminal 301 (labeled "DRAIN" in FIG. 3B) of the hybrid driver 300. For a hybrid driver 300 coupled to the load 330 in high-side configuration, the off-state diagnostic circuitry 310 may be coupled to a source terminal of the hybrid driver 300.

The off-state diagnostic circuitry 310 includes a comparator 3100, a comparator inverter 3110, a pull-up current source 3120 (or "first current source 3120) and a pull-down current source 3130 (or "second current source 3130").

The comparator 3100 is coupled to the drain terminal 301, a terminal that supplies a reference voltage $V_{DS(OL)}$, the pull-up current source 3120 and the pull-down current source 3130. The comparator 3100 outputs an off-state diagnostic signal OFF Diag having a voltage based on a difference between a drain voltage at the drain terminal 301 and the reference voltage $V_{DS(OL)}$. The comparator inverter 3110 is coupled to the output of the comparator 3100, and outputs an inverted off-state diagnostic signal $\overline{OFFdiag}$ that has an inverse voltage polarity of the off-state diagnostic signal OFF Diag.

The pull-up and pull-down current sources 3120, 3130 are switchable current sources that may be turned on or off in response to an input signal. The pull-up current source 3120 receives a pull-up control signal up_on for controlling an on and off state of the pull-up current source 3120. The pull-down current source 3130 receives a pull-down control signal dw_on for controlling an on and off state of the pull-down current source 3130. In operation, the pull-up current source 3120, when active, pumps current into the load 330, and the pull-down current source 3130, when active, drains current from the load 330.

The off-state diagnostic circuitry 310 may detect two or more kinds of faults, including an open load fault and a short fault (e.g., to battery in HS configuration or to ground in LS configuration). The diagnosis may be available upon request by the interface 140. In some embodiments, the diagnosis is implemented over two different temporal phases: a first phase and a second phase. The diagnosis is described with reference to the low-side configuration. In high-side configuration, the diagnosis phases may be switched, such that the first phase follows the second phase, and the sensed node may be the source terminal instead of the drain terminal.

In the first phase, the pull-down current source 3130 is active while the pull-up current source 3120 is off. In this condition, if the drain voltage remains above the reference voltage $V_{DS(OL)}$, the comparator 3100 output is low, which means that the load 330 is present. If the drain voltage decreases below the reference voltage $V_{DS(OL)}$, the comparator 3100 output is high, indicating the presence of a fault.

In the second phase, following the first phase, the output of the comparator is 3100 set to '1' if a faulty condition has been found. The pull-up current source 3120 is activated while the pull-down current source 3130 is off. After the pull-up activation, if the drain voltage rises and exceeds the reference voltage $V_{DS(OL)}$, an open load fault is reported. If the drain voltage remains constant and equal to zero (e.g., ground) for the whole diagnosis time, instead, a short to ground fault is reported.

Figure 4A:
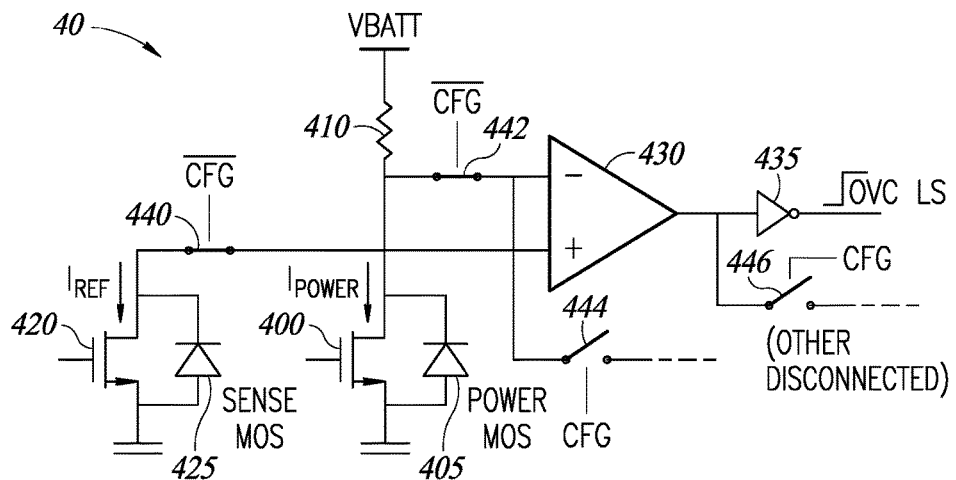
FIGS. 4A and 4B are schematic diagrams of on state diagnostic circuitry in accordance with various embodiments.
Figure 4B:
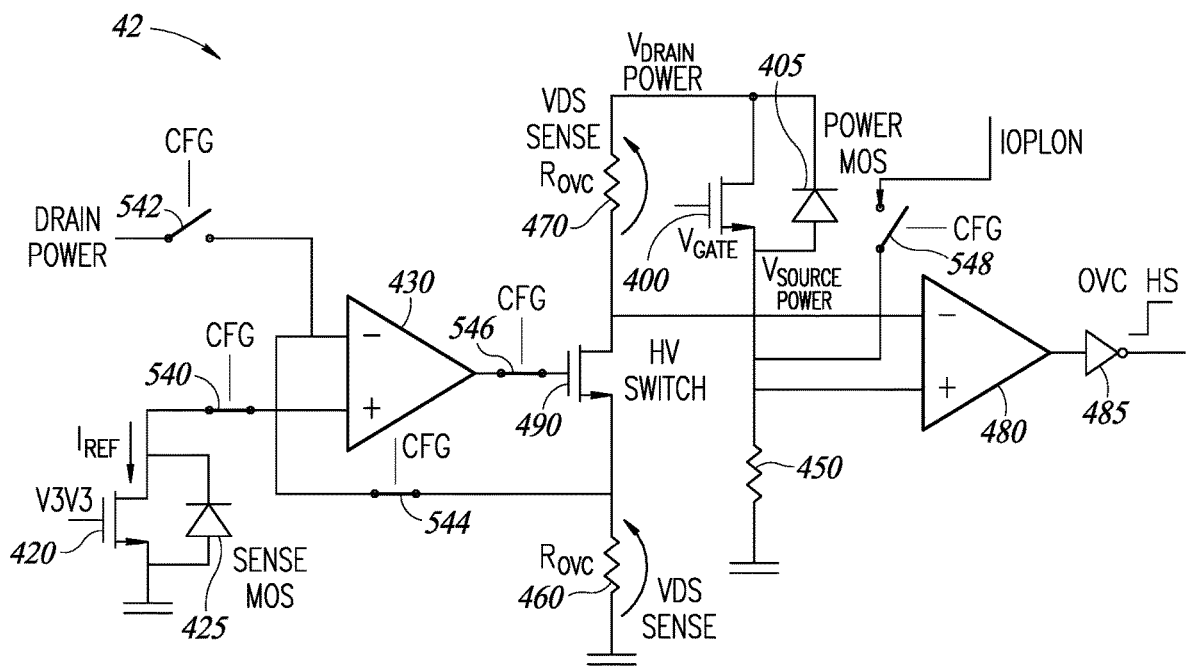
Figures 4C, 4D:
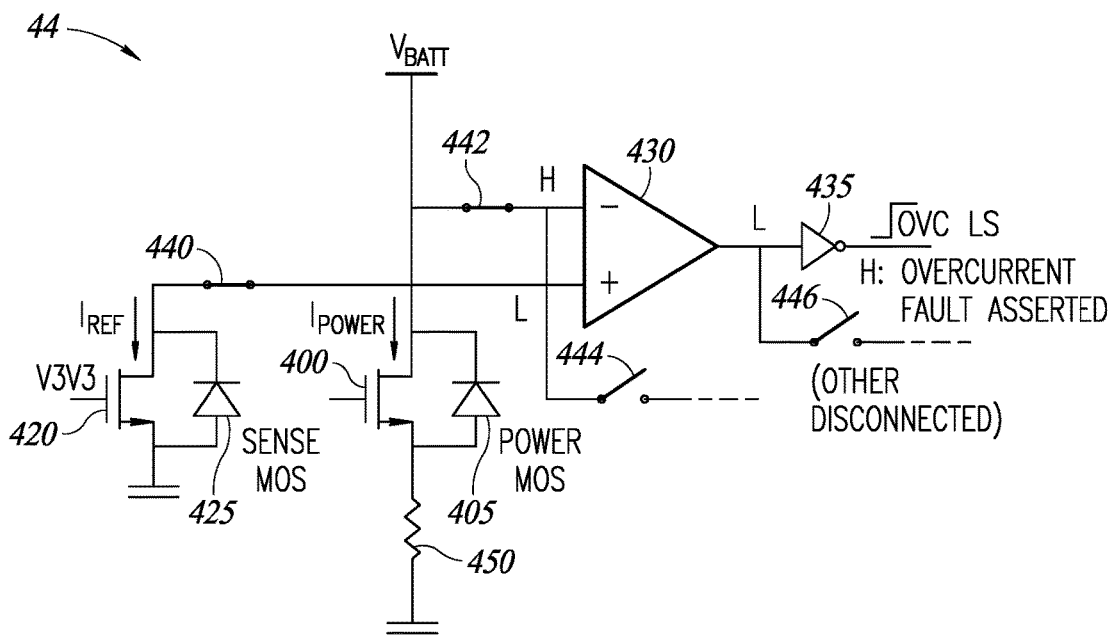
FIG. 4C is a diagram of a switch control mapping in accordance with various embodiments.
FIG. 4D is a diagram illustrating low-side configured on-state diagnostic circuitry coupled to a high-side configured hybrid driver in accordance with various embodiments.

FIGS. 4A and 4B are schematic diagrams of on-state diagnostic circuitry 40 in accordance with various embodiments. FIG. 4A illustrates low-side overcurrent detection. FIG. 4B illustrates high-side overcurrent detection. FIG. 4C illustrates switch control mapping in accordance with various embodiments. FIG. 4D illustrates a false overcurrent fault assertion when a high-side configured hybrid driver is detected by low-side configured on-state diagnostic circuitry.

In FIG. 4A, a transistor 400 of a hybrid driver in low-side configuration (e.g., load 410 coupled to drain terminal of the transistor 400) is diagnosed for overcurrent fault. Diode 405 represents the body-to-drain diode of the transistor 400. The transistor 400 is coupled to a load 410 at the drain terminal of the transistor 400. The load 410 is coupled between the drain terminal and a power supply node having, for example, battery voltage VBatt.

The on-state diagnostic circuitry 40 includes a first comparator 430, a comparator inverter 435, a sense transistor 420, and switches 440, 442, 444, 446. Diode 425 represents the body-to-drain diode of the sense transistor 420. The on-state diagnostic circuitry 40 may be used as the on-state diagnostic circuitry 320 of FIG. 3A. The on-state diagnostic circuitry 40 may be, or be included in, the diagnostic circuitry 150 of FIG. 1.

The sense transistor 420 may be a scaled-down version of the transistor 400, and may be supplied by a reference current Iref that is a multiple (e.g., a small fraction, such as a tenth) of power current IPower drawn by the transistor 400. In some embodiments, the reference current Iref has a fixed value.

The first comparator 430 has an inverting input terminal (labeled "−"), a non-inverting input terminal (labeled "+") and an output terminal. The inverting input terminal of the first comparator 430 is coupled to a drain terminal of the transistor 400 and the load 410. The non-inverting input terminal is coupled to a drain terminal of the sense transistor 420. Output of the first comparator 430 may be a voltage based on difference between drain-source voltage $V_{DS,Power}$ of the transistor 400 and drain-source voltage $V_{DS,Sense}$ of the sense transistor 420. The output of the first comparator 430 may be inverted by the comparator inverter 435 to generate a low-side overcurrent detection signal OVC LS. For example, when the drain-source voltage $V_{DS,Power}$ of the transistor 400 at the inverting terminal exceeds the drain-source voltage $V_{DS,Sense}$ of the sense transistor 420 at the non-inverting terminal, the output of the first comparator 430 may go low, and the output of the comparator inverter 435 may go high, indicating assertion of the overcurrent fault.

The switches 440, 442, 444, 446 may be switched on or off (e.g., may be closed or opened) in response to polarity of the configuration signal CFG. For example, when the configuration signal CFG is low or zero, indicating the hybrid driver is low-side configured, the switches 440, 442 may be switched on, and the switches 444, 446 may be switched off. This is shown in FIG. 4A by input signals to the switches 440, 442, 444, 446 having polarity equal to the configuration signal CFG or an inverted configuration signal $\overline{CFG}$. In some embodiments, the switches 440, 442, 444, 446 are transistors or pass gates that receive the configuration signal CFG or the inverted configuration signal $\overline{CFG}$ at gate terminals thereof. In some embodiments, the configuration signal CFG is the inverted off-state diagnostic signal $\overline{OFFdiag}$ generated by the off-state diagnostic circuitry 310. Switching off the switches 444, 446 may electrically isolate the circuit components shown in FIG. 4A from other circuit components used for overcurrent detection of the hybrid driver when high-side configured.

In FIG. 4B, a transistor 400 of a hybrid driver in high-side configuration (e.g., load 450 coupled to source terminal of the transistor 400) is diagnosed for overcurrent fault. The transistor 400 is coupled to a load 450 at the source terminal of the transistor 400. The load 450 is coupled between the source terminal and a ground node having, for example, zero voltage. In FIG. 4B, the configuration signal CFG may be high or 1, indicating the hybrid driver is high-side configured, which may be the opposite polarity of that shown in FIG. 4A.

On-state diagnostic circuitry 42 includes circuit components shown in FIG. 4B other than the transistor 400 and the load 450. The on-state diagnostic circuitry 42 includes second comparator 480, comparator inverter 485, first comparator 430, sense transistor 420, sense resistors 460, 470, second transistor 490 (or "switch 490" or "high-voltage switch 490") and switches 540, 542, 544, 546, 548. In some embodiments, one or more components of the on-state diagnostic circuitry 42 are components of the on-state diagnostic circuitry 40. For example, the switches 540, 542 may be the switches 440, 442, respectively.

A non-inverting input of the second comparator 480 is coupled to the load 450 and the source terminal of the transistor 400. An inverting input of the second comparator 480 is coupled to the drain terminal of the second transistor 490 and the sense resistor 470. An output of the second comparator 480 is coupled to the comparator inverter 485. Voltage at the output of the second comparator 480 is based on difference in voltage at the inverting input and voltage at the non-inverting input. For example, when the voltage across the load 450 (e.g., the voltage at the non-inverting input) is lower than the-voltage at the source terminal of the second transistor 490, the output of the second comparator 480 is low or zero (e.g., 0 Volts), and the output of the comparator inverter 485 is high or 1 (e.g., 3.3 Volts, 5 Volts, or the like). When the voltage across the load 450 (e.g., the voltage at the non-inverting input) is higher than the voltage at the source terminal of the second transistor 490, the output of the second comparator 480 is high or 1 (e.g., 3.3 Volts, 5 Volts, or the like), and the output of the comparator inverter 485 is low or 0 (e.g., 0 Volts).

Voltage at the source of the second transistor 490, which is also voltage across the sense resistor 460, approaches drain-source voltage $V_{DS,Sense}$ of the sense transistor 420 due to a negative feedback loop including the first comparator 430 and the second transistor 490. The sense resistors 460, 470 have the same or substantially the same resistance Rovc, and as such, voltage drop across the sense resistor 470 is the same or substantially the same as that across the sense resistor 460, e.g., $V_{DS,Sense}$. As such, voltage at the drain terminal of the second transistor 490, which is the voltage at the inverting input of the second comparator 480, is equal to the difference of the drain voltage $V_{drain,Power}$ of the transistor 400 and the drain-source voltage $V_{DS,Sense}$ of the sense transistor 420. An overcurrent fault may be asserted when the drain-source voltage $V_{DS,Power}$ of the transistor 400 exceeds the drain-source voltage $V_{DS,Sense}$ of the sense transistor 420, which corresponds to the voltage at the inverting terminal of the second comparator 480 being greater than the voltage at the non-inverting terminal of the second comparator 480.

The switches 540, 542, 544, 546, 548 may be switched on or off (e.g., may be closed or opened) in response to polarity of the configuration signal CFG. For example, when the configuration signal CFG is high or 1, indicating the hybrid driver is high-side configured, the switches 540, 544, 546 may be switched on, and the switches 542, 548 may be switched off. This is shown in FIG. 4B by input signals to the switches 540, 542, 544, 546, 548 having polarity equal to the configuration signal CFG or the inverted configuration signal $\overline{CFG}$. In some embodiments, the switches 540, 542, 544, 546, 548 are transistors or pass gates that receive the configuration signal CFG or the inverted configuration signal $\overline{CFG}$ at gate terminals thereof. In some embodiments, the configuration signal CFG is the inverted off-state diagnostic signal $\overline{OFFdiag}$ generated by the off-state diagnostic circuitry 310. The switches 542, 548 being switched off may disconnect the circuit components of FIG. 4B from the drain terminal of the transistor 400 (labeled "DRAIN,Power") and from an open load detection current source (labeled "IOPLon"), respectively.

Referring to FIGS. 4A and 4B, in some embodiments, the switches 440, 442, 444, 446, 540, 542, 544, 546, 548 may be switched on or off by switching signals other than the configuration signal CFG and the inverted configuration signal $\overline{CFG}$. For example, polarity of the configuration signal CFG may determine on/off state of each of the switches 440, 442, 444, 446, 540, 542, 544, 546, 548. An example mapping 48 is illustrated conceptually in FIG. 4C. Such a mapping relationship between the on/off states of the switches 440, 442, 444, 446, 540, 542, 544, 546, 548 and the configuration signal CFG may be accomplished by a simple digital logic circuit (e.g., combinatorial logic 465 of FIG. 4E) that receives the configuration signal CFG as input, and outputs the switching signals corresponding to the respective switches 440, 442, 444, 446, 540, 542, 544, 546, 548 based on the mapping 48 of FIG. 4C. Using the mapping 48 of FIG. 4C may provide greater flexibility than using the configuration signal CFG directly as an input to the switches 440, 442, 444, 446, 540, 542, 544, 546, 548, e.g., to gate terminals thereof.

FIG. 4D illustrates a false overcurrent fault assertion when a high-side configured hybrid driver is detected by low-side configured on-state diagnostic circuitry 44. FIG. 4D is similar in many respects to FIG. 4A, but instead of the hybrid driver being configured in the low-side configuration, in FIG. 4D, the hybrid driver is configured in the high-side configuration, such that the load 450 is coupled between the source terminal of the transistor 400 and the ground node, and the drain terminal of the transistor 400 is coupled to the power supply node having voltage VBatt. As such, instead of sensing the drain-source voltage $V_{DS,Power}$ of the transistor 400, the voltage at the inverting terminal of the comparator 430 is simply the voltage VBatt (e.g., 3 Volts to 42 Volts). Because the voltage at the inverting terminal of the comparator 430 is much greater than the drain-source voltage $V_{DS,Sense}$ of the sense transistor 420 at the non-inverting terminal, the output of the comparator 430 goes low, and the overcurrent fault is asserted at the output of the comparator inverter 435. In response to the overcurrent fault, the hybrid driver including the transistor 400 is turned off. This situation is possible when the device 10 transitions to the fail-safe operating mode from the sleep/reset operating mode, as described above with reference to FIG. 1A.

Figure 4E:
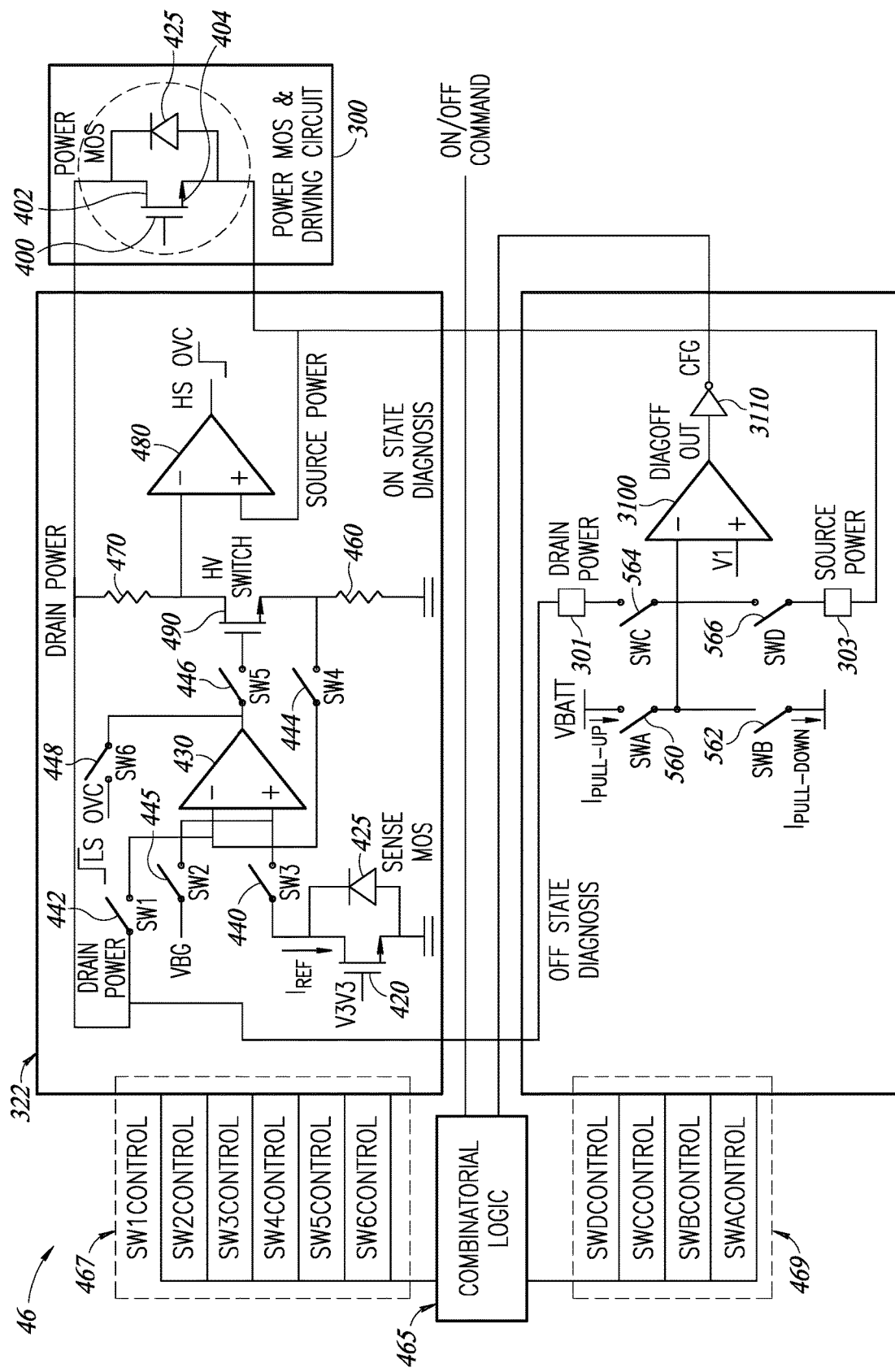
FIG. 4E is a schematic diagram illustrating diagnostic circuitry in accordance with various embodiments.

FIG. 4E illustrates diagnostic circuitry 46 coupled to a hybrid driver 300 in accordance with various embodiments. The diagnostic circuitry 46 includes off-state diagnostic circuitry 312, on-state diagnostic circuitry 322 and combinatorial logic 465. The off-state diagnostic circuitry 312 may be employed as the off-state diagnostic circuitry 310 of FIG. 3A, and the on-state diagnostic circuitry 322 may be employed as the on-state diagnostic circuitry 320. Many details of the off-state diagnostic circuitry 312 and the on-state diagnostic circuitry 322 are similar to those described with reference to FIGS. 4A and 4B and FIG. 3B, respectively. In FIG. 4E, like reference numerals are used to refer to like components, for example, shown in FIGS. 4A, 4B and 3B.

The off-state diagnostic circuitry 322 includes switches 560, 562, 564 and 566. The switch 560, labeled "SWA," is coupled to a pull-up current source (e.g., the pull-up current source 3120) that supplies pull-up current Ipull-up, and is coupled to the inverting terminal of the comparator 3100. The switch 562, labeled "SWB," is coupled to a pull-down current source (e.g., the pull-down current source 3130) that supplies pull-down current Ipull-down, and is coupled to the inverting terminal of the comparator 3100.

The switch 564, labeled "SWC," is coupled to a drain terminal 402 of the transistor 400, for example, by a drain node 301, and is coupled to the inverting terminal of the comparator 3100. The switch 566, labeled "SWD," is coupled to a source terminal 404 of the transistor 400, for example, by a source node 303, and is coupled to the inverting terminal of the comparator 3100. Reference voltage V1 is a fixed voltage threshold coupled to the non-inverting terminal of the comparator 3100. The switches 564, 566 are opened or closed to couple the inverting terminal of the comparator 3100 to the drain terminal 402 or the source terminal 404 of the transistor 400, respectively. For example, the switch 564 may be closed to couple the inverting terminal of the comparator 3100 to the drain terminal 402 of the transistor 400, such as when the hybrid driver 300 is coupled to a load in the low-side configuration.

In some embodiments, the switches 560, 562 are transistors other than the pull-up and pull-down current sources 3120, 3130 that are connected in series between the respective pull-up or pull-down current source 3120, 3130 and the inverting terminal of the comparator 3100.

The on-state diagnostic circuitry 322 includes switches 445, 448. The switch 445 is coupled between a bandgap voltage supply (not shown) and the non-inverting terminal of the comparator 430. The switch 448 is coupled to the output terminal of the comparator 430 for enabling and disabling output of a low-side overcurrent signal, labeled "LS OVC."

The combinatorial logic 465 is coupled to the output terminal of the comparator inverter 3110 of the off-state diagnostic circuitry 312, and receives the configuration signal CFG from the comparator inverter 3110. The combinatorial logic 465 may be coupled to upper-level logic (e.g., the logic circuitry 130), and may receive an enable signal (labeled "ON/OFF Command") from the upper-level logic.

Based on the configuration signal CFG and the enable signal (labeled "ON/OFF Command"), the combinatorial logic 465 outputs first switch control signals 467 and second switch control signals 469. The first switch control signals 467, labeled "SW1Control," "SW2Control," . . . "SW6Control," are for controlling open/closed state of the switches 442, 445, 440, 444, 446, 448 of the on-state diagnostic circuitry 322, respectively. The second switch control signals 469, labeled "SWAControl," "SWBControl," "SWCControl" and "SWDControl," are for controlling open/closed state of the switches 560, 562, 564, 566 of the off-state diagnostic circuitry 312, respectively.

Figure 5:
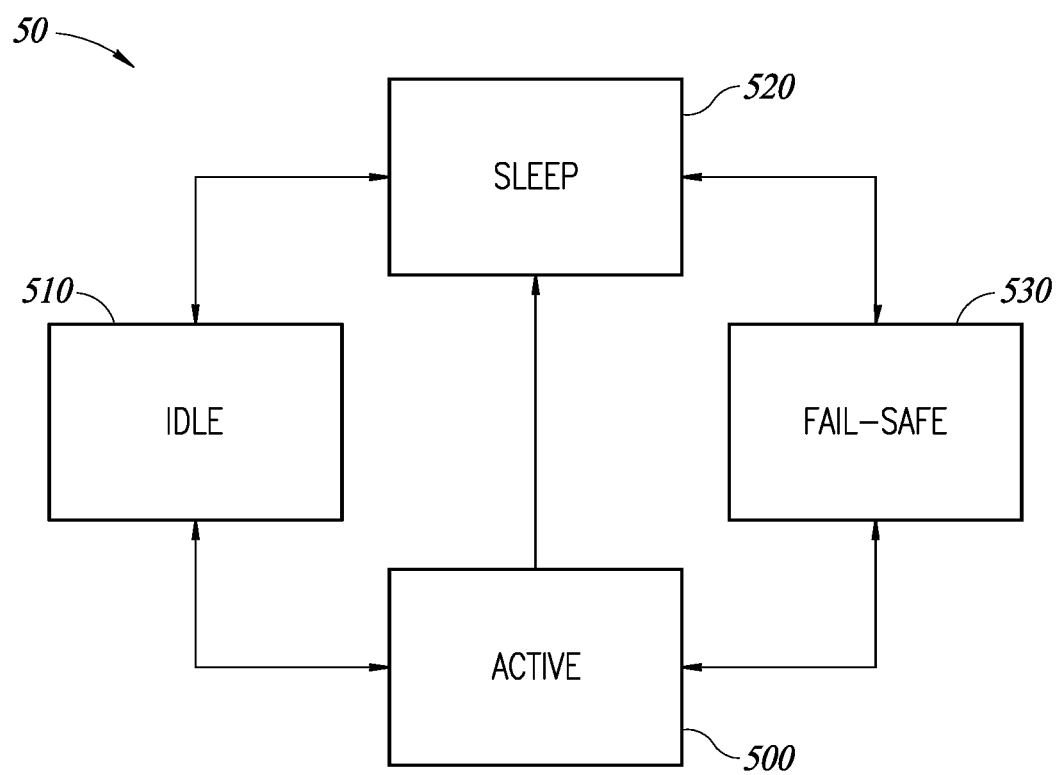
FIG. 5 is a diagram illustrating operating modes of a device in accordance with various embodiments.

FIG. 5 is a diagram illustrating operating modes 50 of a device (e.g., the device 10) in accordance with various embodiments. The device 10 may operate in an active operating mode 500, an idle operating mode 510, a sleep/reset operating mode 520 and a fail-safe operating mode 530. In the active operating mode 500 and the fail-safe operating mode 530, the hybrid drivers may be switched on to drive the respective loads coupled thereto. In the idle and sleep operating modes 510, 520, the hybrid drivers are switched off. The idle operating mode 510 includes availability of interface communication, for example, over the interface 140. Interface communication may not be available in the sleep operating mode 520. In the sleep operating mode 520, interface registers (e.g., the memory circuitry 142 of the interface 140) may be reset to default values and inaccessible for reading, writing or both. In the fail-safe operating mode 530, the interface registers may be available only for reading and not for writing.

Transitions are available between the operating modes 50 as indicated by unidirectional or bidirectional arrows in FIG. 5. For example, the sleep operating mode 520 may be reached from any of the other operating modes 500, 510, 530. Transition is available from the active operating mode 500 to any of the other operating modes 510, 520, 530. Transition to and from the active operating mode 500 is available from the idle operating mode 510 and the fail-safe operating mode 530.

As described above, in a transition from the sleep operating mode 520 to the fail-safe operating mode 530, the interface registers, which may store the configuration signal CFG, are reset (e.g., to "0," corresponding to low-side configuration). Following transition to the fail-safe operating mode 530, the interface registers are read-only, and the correct configuration information of each hybrid driver is not updated due to lack of write access to the interface registers. As such, mismatch may be present the actual operative condition of the hybrid drivers and the configuration information used to configure the diagnostic circuitry coupled to the hybrid drivers. For example, instead of coupling to the source terminal of the transistor 400 of the high-side configured hybrid driver, the mismatch may result in coupling to the drain terminal of the transistor 400, as illustrated in FIG. 4D. As such, a false overcurrent fault may be asserted, leading to the hybrid driver being powered off.

Figure 6A:
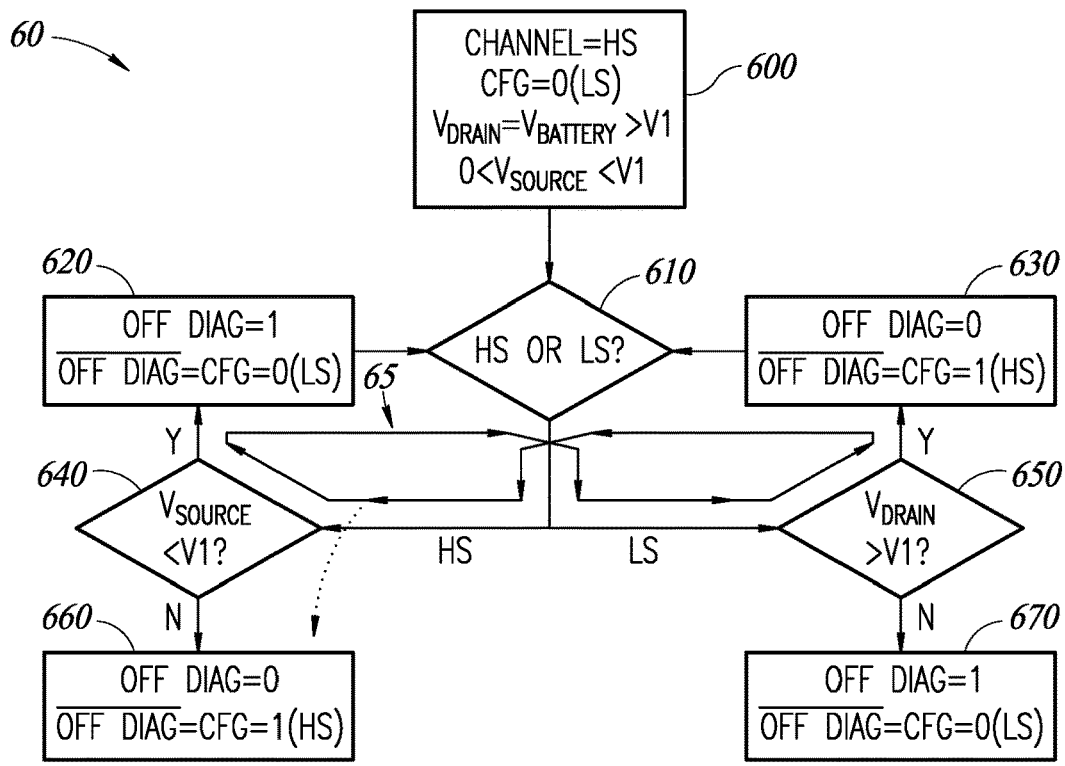
FIGS. 6A and 6B are flow diagrams of a method in accordance with various embodiments.
Figure 6B:
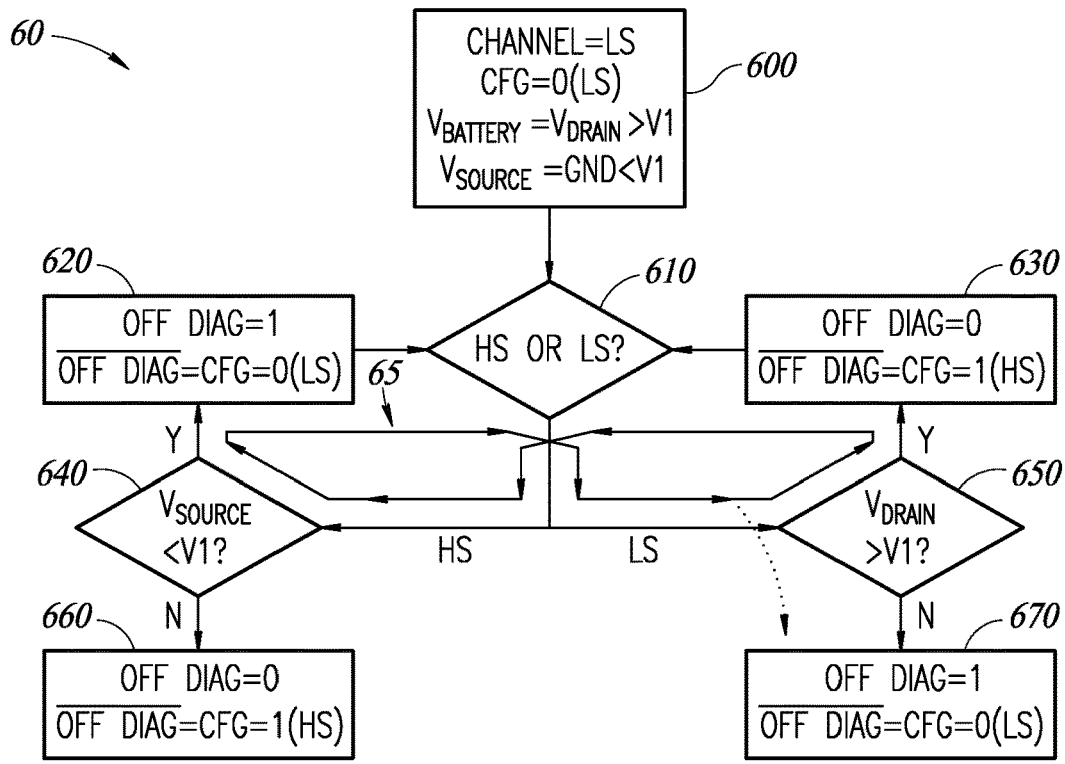

FIGS. 6A and 6B are flow diagrams of a method 60 in accordance with various embodiments. In the method 60, the inverted off-state diagnostic signal is used as the configuration signal CFG, which allows the configuration signal CFG to settle to a value indicating the correct operative condition (high-side or low-side) of the hybrid driver, even in the presence of mismatch initially between the configuration signal CFG and the operative condition. FIG. 6A illustrates operation of off-state diagnostic circuitry, such as the off-state diagnostic circuitry 310, when mismatch is present, such that the hybrid driver is high-side (HS) configured and the configuration signal is low or zero, corresponding to low-side (LS) configured. FIG. 6B illustrates operation of the off-state diagnostic circuitry when no mismatch is present, such that the hybrid driver is low-side configured and the configuration signal is low or zero, corresponding to low-side configured. Operations or states 600-670 illustrated in FIG. 6B are the same as illustrated in FIG. 6A, the difference being in initial conditions present in operation 600, and progression through the closed loop formed by operations 610-650 when the hybrid driver is high-side configured (FIG. 6A) or low-side configured (FIG. 6B). Description of the method 60 may include reference to embodiments shown in FIGS. 1-4E, but the method 60 is not limited to use in the embodiments shown in FIGS. 1-4E, and may be used in other devices that include diagnostic circuitry for performing on-state and off-state diagnoses of hybrid drivers.

In FIG. 6A, initial conditions are shown in operation 600. The hybrid driver (or "channel," e.g., the hybrid driver 102) is high-side configured, and the configuration signal CFG is low or zero (corresponding to low-side configured). Drain voltage $V_{drain}$ of the hybrid driver (e.g., the transistor 400) is a power supply voltage $V_{battery}$, which is higher than a reference voltage V1. Source voltage $V_{source}$ of the high-side configured hybrid driver is between a low voltage (e.g., 0

Volts) and the reference voltage V1. When high-side configured, if no fault is present, the source voltage $V_{source}$ rises to approach the power supply voltage $V_{battery}$ when the hybrid driver is switched on.

In operation 610, if the configuration signal CFG is low or zero, corresponding to low-side configured, the method 60 proceeds to operation 650. If the configuration signal CFG is high or 1, corresponding to high-side configured, the method 60 proceeds to operation 640. When the configuration signal CFG is initially low, for example, after entering the fail-safe operating mode 530 from the sleep operating mode 520, the method 60 proceeds to operation 650.

In operation 650, the drain voltage $V_{drain}$ is sensed and compared with the reference voltage V1. For example, the drain voltage $V_{drain}$ of the drain terminal 402 of the transistor 400 may be sensed by closing the switch 564 illustrated in FIG. 4E. When the drain voltage $V_{drain}$ is greater than the reference voltage V1, the method 60 proceeds to operation 630. When the drain voltage $V_{drain}$ is not greater than the reference voltage V1, the method 60 proceeds to operation 670. Initially, as shown in operation 600, the drain voltage $V_{drain}$ equals the power supply voltage $V_{battery}$, which is higher than the reference voltage V1. As such, the method proceeds to operation 630.

In operation 630, as a result of the drain voltage $V_{drain}$ being greater than the reference voltage V1, the off-state diagnosis signal OFF Diag goes to low or zero, and the inverted off-state diagnosis signal $\overline{OFFdiag}$, which is the configuration signal CFG, goes to high or 1, corresponding to high-side configuration. In operation 610, with the configuration signal CFG indicating high-side configuration, the method 60 proceeds to operation 640.

In operation 640, due to the high-side configuration indication from the configuration signal CFG, the source terminal of the transistor is sensed. For example, the source voltage $V_{source}$ of the source terminal 404 of the transistor 400 may be sensed by closing the switch 566 shown in FIG. 4E. If the source voltage $V_{source}$ is less than the reference voltage V1 (e.g., the reference voltage V1 of FIG. 4E), the method 60 proceeds to operation 620. If the source voltage $V_{source}$ is not less than the reference voltage V1, the method 60 proceeds to operation 660. While the source voltage $V_{source}$ continues to rise and has not exceeded the reference voltage V1, the method 60 proceeds to operation 620 from operation 640.

In operation 620, as a result of the source voltage $V_{source}$ being less than the reference voltage V1, the off-state diagnosis signal OFF Diag goes to high or 1, and the inverted off-state diagnosis signal $\overline{OFFdiag}$, which is the configuration signal CFG, goes to low or zero, corresponding to low-side configuration. In operation 610, with the configuration signal CFG indicating low-side configuration, the method 60 proceeds to operation 650.

The operations 610-650 form a closed loop 65 shown as a solid line with arrows indicating direction of procession of the method 60 through the operations 610-650. As described above, when the hybrid driver is high-side configured, the source voltage $V_{source}$ rises to approach the power supply voltage $V_{battery}$ if no fault is present. As such, the closed loop 65 continues until the source voltage $V_{source}$ exceeds the reference voltage V1. During this time, the configuration signal CFG toggles between high (or 1) and low (or 0). Following the source voltage $V_{source}$ exceeding the reference voltage V1, the method 60 proceeds from the operation 640 to the operation 660, as indicated by a dashed arrow in FIG. 6A.

In the operation 660, the off-state diagnostic signal OFF diag goes to low or zero, and the inverted off-state diagnostic signal $\overline{OFFdiag}$, which is the configuration signal CFG, goes to high or 1, corresponding to the high-side configuration, which matches the configuration of the hybrid driver. As such, the configuration signal CFG stabilizes at high or 1, and correctly represents the operative condition (e.g., high-side configured) of the hybrid driver.

Figure 6C:
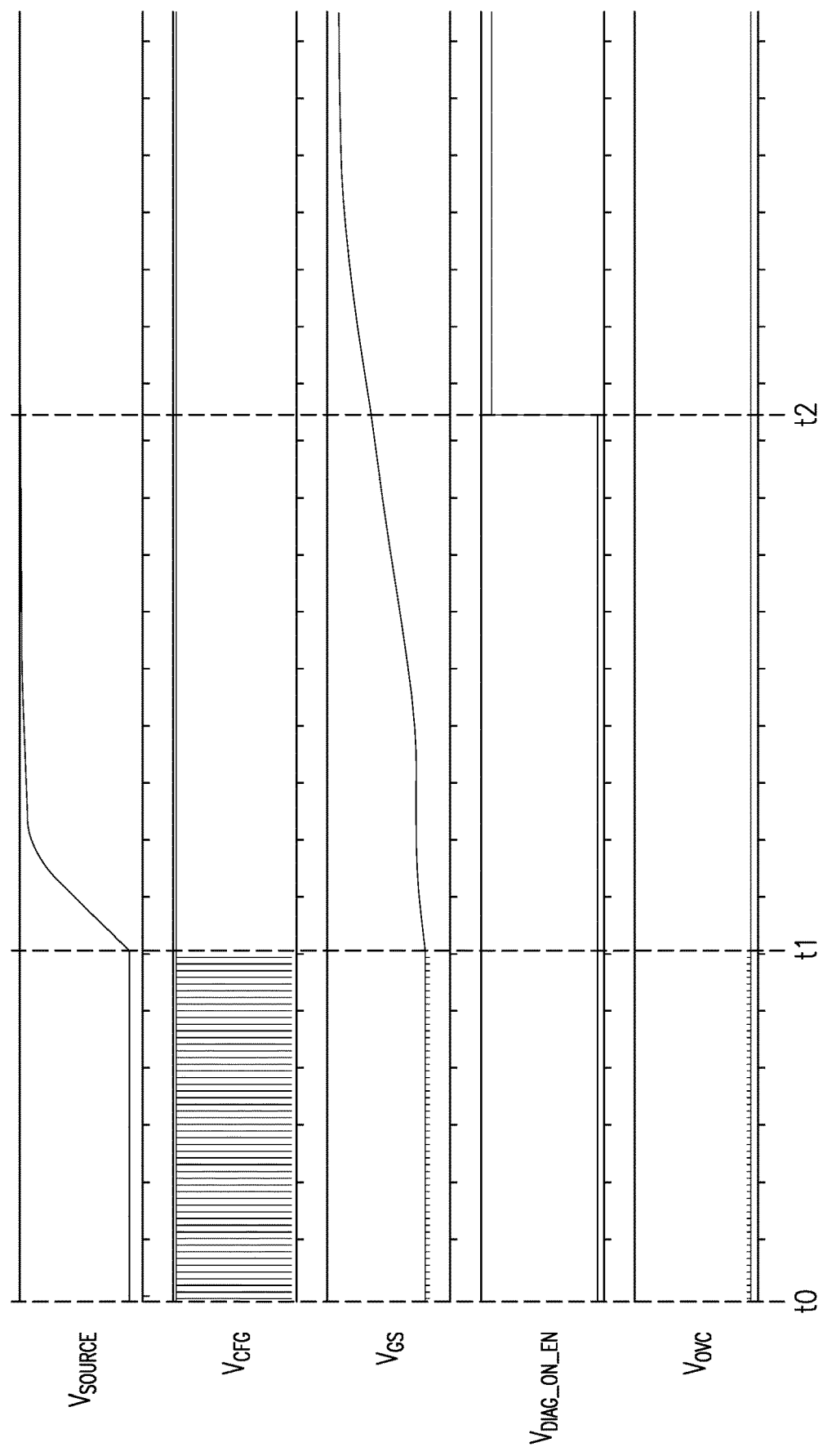
FIG. 6C is a waveform diagram in accordance with various embodiments.

The above toggling and stabilization of the configuration signal CFG due to the closed loop of operations 610-650 is illustrated in FIG. 6C, which is a waveform diagram. Prior to the source voltage $V_{source}$ exceeding the reference voltage V1, from a time t0 to a time t1, the configuration signal CFG toggles. Following the source voltage $V_{source}$ exceeding the reference voltage V1, at the time t1, the configuration signal CFG stabilizes at high or 1. At a time t2, well after the configuration signal CFG has stabilized, the on-state diagnostic circuitry is enabled, as illustrated by a transition from low to high in a signal $V_{DIAG\_ON\_EN}$.

If an overcurrent fault is present, the closed loop of operations 610-650 does not stabilize. When the on-state diagnostic circuitry is enabled, the on-state diagnostic circuitry detects that the drain-source voltage $V_{DS,Power}$ of the transistor 400 is greater than the drain-source voltage $V_{DS,Sense}$ of the sense transistor 420 (in either CFG=0 or CFG=1), and powers off the transistor 400.

FIG. 6B illustrates the hybrid driver being low-side configured and the configuration signal CFG matching the operative condition of the hybrid driver by being low or zero, corresponding to low-side configuration. When the hybrid driver is low-side configured, the drain voltage $V_{drain}$ decreases to a low voltage (e.g., hundreds of millivolts) when the hybrid driver is switched on.

As shown in FIG. 6B, in operation 600, the drain voltage $V_{drain}$ is between the power supply voltage $V_{battery}$ and the reference voltage V1, and the source voltage $V_{source}$ is a ground voltage (e.g., 0V), which is less than the reference voltage V1. While the drain voltage $V_{drain}$ is greater than the reference voltage V1, the method 60 proceeds through the closed loop including operations 610-650. During this period, the configuration signal CFG toggles between high (or 1) and low (or zero). Following the drain voltage $V_{drain}$ falling below the reference voltage V1, the method 60 proceeds to operation 670, illustrated by the dashed arrow in FIG. 6B. In the operation 670, the configuration signal CFG is low or zero, which matches the operative condition (e.g., low-side configured) of the hybrid driver.

As described with reference to FIG. 6A, and similarly in FIG. 6B, the configuration signal CFG stabilizes before on-state diagnosis begins, avoiding spurious overcurrent assertion. If overcurrent is present, the same scenario as described above occurs. The closed loop of operations 610-650 does not stabilize, and when the on-state diagnostic circuitry is enabled, the on-state diagnostic circuitry detects that the drain-source voltage $V_{DS,Power}$ of the transistor 400 is greater than the drain-source voltage $V_{DS,Sense}$ of the sense transistor 420 (in either CFG=0 or CFG=1), and powers off the transistor 400.

In either of the scenarios described above with reference to FIG. 6A or FIG. 6B, an open load fault or short fault may be present in the hybrid driver coupled to the diagnostic circuitry performing the method 60. If either fault is present, the configuration signal CFG is correctly set when the reference voltage V1 is overcome. If neither fault is present, the toggling of the configuration signal CFG may be rejected by a digital filter.

Figure 7:
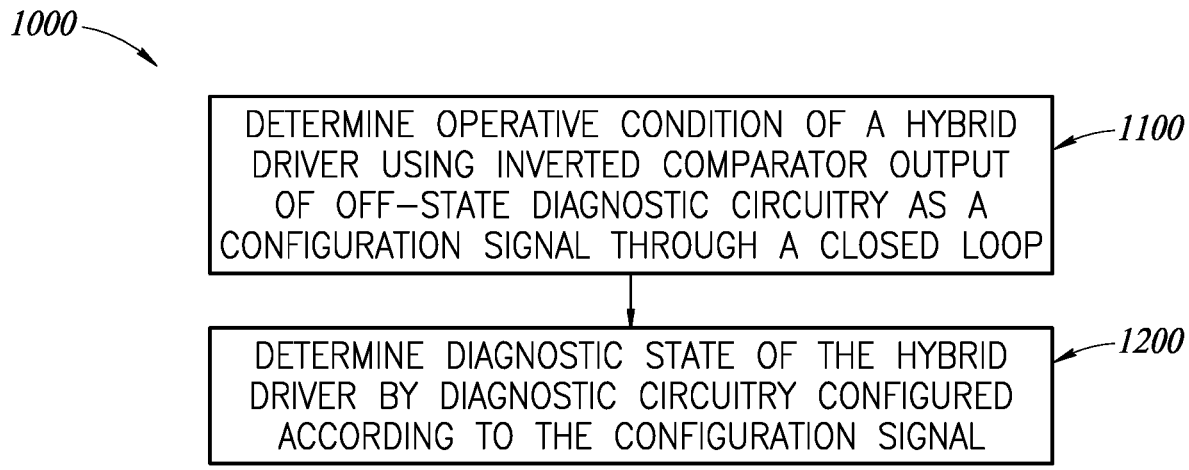
FIG. 7 is a flow diagram of a method in accordance with various embodiments.

FIG. 7 is a flow diagram of a method 1000 in accordance with various embodiments. The method includes operations 1100 and 1200.

In operation 1100, an operative condition of a hybrid driver (e.g., the hybrid driver 102) is determined using an inverted comparator output of off-state diagnostic circuitry as a configuration signal CFG through a closed loop. For example, the inverted off-state diagnostic signal $\overline{\text{OFFdiag}}$ outputted by the comparator inverter 3110 of the off-state diagnostic circuitry 310 may be used as the configuration signal CFG through the closed loop including the operations 610-650 of the method 60. Toggling of the configuration signal CFG may result in operation of the switches 440, 442, 444, 446, 540, 542, 544, 546, 548 according to the mapping 48 illustrated in FIG. 4C. The operative condition of the hybrid driver may be determined when the configuration signal CFG stabilizes, as described with reference to FIGS. 6A and 6B.

In operation 1100, a diagnostic state of the hybrid driver is determined by diagnostic circuitry configured according to the configuration signal. For example, an overcurrent fault of the hybrid driver 102 may be determined by the on-state diagnostic circuitry 310 configured according to the configuration signal CFG. As described with reference to FIG. 3B, sensed node (e.g., drain terminal or source terminal) and temporal sequence of turning on the pull-up current source 3120 and the pull-down current source 3130 may be controlled according to the configuration signal CFG.

In some embodiments, the methods 60 and 1000 include a number of operations. It should be noted that the operations of the methods 60, 1000 may be rearranged or otherwise modified (e.g., removed) within the scope of the various embodiments. It should be noted that additional processes may be provided before, during, and after the methods 60, 1000 and that some other processes may be only briefly described herein. For example, the method 1000 may include filtering the configuration signal CFG digitally while the configuration signal CFG is toggling.

Figure 8:
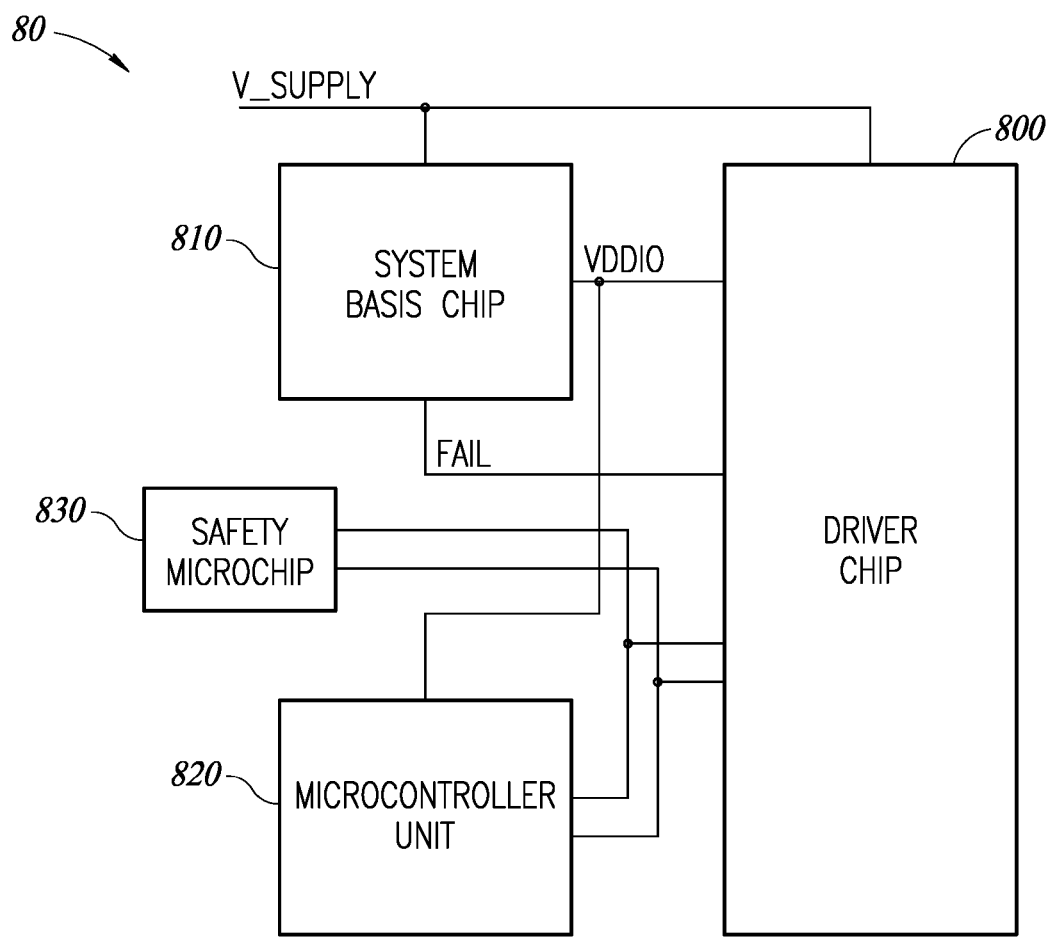
FIG. 8 is a diagram of a system in accordance with various embodiments.

FIG. 8 is a diagram of a system 80 in accordance with various embodiments. The system 80 includes a driver chip 800, a system basis chip (SBC) 810, a microcontroller unit (MCU) chip 820 and a safety microchip 830. Each chip 800, 810, 820, 830 may include an integrated circuit die in a package, and the chips 800, 810, 820, 830 may be arranged on a circuit board, such as a printed circuit board, a flexible printed circuit board or other appropriate substrate on which electronic chips may be placed and interconnected.

The driver chip 800 may be the same as the device 10 of FIG. 1, and includes hybrid drivers, such as the hybrid drivers 102. The driver chip 800 is coupled to the microcontroller unit and the system basis chip, and includes a driver circuit (e.g., the hybrid driver 102), and diagnostic circuitry (e.g., the diagnostic circuitry 150) including an on-state diagnostic circuit (e.g., the on-state diagnostic circuitry 310) and an off-state diagnostic circuit (e.g., the off-state diagnostic circuitry 320). The diagnostic circuitry, in operation: determines a configuration signal (e.g., the configuration signal CFG) associated with high-side or low-side configuration of the driver circuit based on a comparator output of the off-state diagnostic circuit. The diagnostic circuitry may determine the configuration in a fail-safe mode. The fail-safe mode may be associated with failure of the MCU chip 820.

The SBC 810 is coupled to the driver chip 800 and the MCU chip 820, and supplies a digital voltage VDDIO to the driver chip 800 and the MCU chip 820. The SBC 810 may include a voltage regulator and logic circuitry. The SBC 810 may output a fail signal FAIL to the driver chip 800. The fail signal FAIL may be used by the driver chip 800 to enter the idle operating mode 510, the fail-safe operating mode 530, or both.

The MCU chip 820 supplies input signals to the driver chip 800, such as parallel inputs used to control operation of one or more of the hybrid drivers 102. In the case that the MCU chip 820 fails, the driver chip 800 may enter the fail-safe operating mode 530, and the safety microchip 830 may take over input of the input signals to the driver chip 800 while the driver chip 800 is in the fail-safe operating mode 530.

Embodiments may provide advantages. By using the inverted comparator output signal $\overline{\text{OFFdiag}}$ as the configuration signal CFG instead of, or in addition to, storing the configuration signal CFG in a register that may become read-only in the fail-safe operating mode, the diagnostic circuitry may properly determine the operative condition (low-side configured or high-side configured) of the hybrid driver, which reduces occurrence of spurious faults or undetected failures. As such, the hybrid driver is less likely to be erroneously powered off due to false assertion, for example, of an overcurrent fault.

In an embodiment, a device includes a driver circuit and diagnostic circuitry coupled to the driver circuit. The diagnostic circuitry includes an on-state diagnostic circuit and an off-state diagnostic circuit. The diagnostic circuitry, in operation: generates a configuration signal associated with an operative condition of the driver circuit based on a comparator output of the off-state diagnostic circuit; diagnoses conditions associated with the driver circuit; and controls operation of the on-state diagnostic circuit based on the configuration signal.

In one embodiment, operation of the off-state diagnostic circuitry is based on the configuration signal. In one embodiment, the on-state diagnostic circuitry, in operation, detects overcurrent of the driver circuit. In one embodiment, the off-state diagnostic circuitry, in operation, detects an open load fault, a short fault, or both of the driver circuit. In one embodiment, the diagnostic circuitry determines the configuration signal in a fail-safe mode of the device. The fail-safe mode may be entered directly from a sleep mode or reset mode. In one embodiment, the comparator output is an inverted output of a comparator of the off-state diagnostic circuitry, and a non-inverted output of the comparator is used to indicate an open load fault, a short fault, or both of the driver circuit. In one embodiment, the off-state diagnostic circuitry and the on-state diagnostic circuitry share some or all of their circuit components with each other.

In one embodiment, the off-state diagnostic circuitry includes a plurality of first switches, and the on-state diagnostic circuitry includes a plurality of second switches. The device includes combinatorial logic coupled to the plurality of first switches and the plurality of second switches. The combinatorial logic, in operation: receives the configuration signal from the off-state diagnostic circuitry; and controls open and closed states of the plurality of first switches and open and closed states of the plurality of second switches based on the configuration signal.

In one embodiment, the off-state diagnostic circuitry includes: a comparator; a first current source coupled to a first input of the comparator; a second current source coupled to the first input of the comparator; and an inverter coupled to an output of the comparator.

In an embodiment, a system includes a microcontroller unit, a system basis chip, and a device coupled to the microcontroller unit and the system basis chip. The device includes a driver circuit and diagnostic circuitry. The diagnostic circuitry includes on-state diagnostic circuitry and off-state diagnostic circuitry. The diagnostic circuitry, in operation: generates a configuration signal associated with an operative condition of the driver circuit based on a comparator output of the off-state diagnostic circuitry; diagnoses conditions associated with the driver circuit; and controls operation of the on-state diagnostic circuitry based on the configuration signal.

In one embodiment, the diagnostic circuitry generates the configuration signal in a fail-safe mode. The fail-safe mode may be associated with failure of the microcontroller unit.

In an embodiment, a method includes: generating a configuration signal associated with an operative condition of a driver circuit based on a comparator output of off-state diagnostic circuitry, the off-state diagnostic circuitry being coupled to the driver circuit; diagnosing conditions associated with the driver circuit; and controlling operation of on-state diagnostic circuitry coupled to the driver circuit, the controlling being based on the configuration signal.

In one embodiment, the generating a configuration signal includes alternately comparing a reference voltage with a source terminal voltage of the hybrid driver and a drain terminal voltage of the hybrid driver. In one embodiment, the generating a configuration signal includes determining the hybrid driver is high-side configured when the inverted comparator output settles following the source terminal voltage exceeding the reference voltage. In one embodiment, the generating a configuration signal includes determining the hybrid driver is low-side configured when the inverted comparator output settles following the drain terminal voltage falling below the reference voltage. In one embodiment, the alternately comparing results in toggling of the configuration signal, and the toggling is rejected by a digital filter.

In one embodiment, the method includes the hybrid driver entering a fail-safe mode from a sleep mode. In some embodiments, the configuration signal stabilizes before the hybrid driver enters an active mode from the fail-safe mode. In some embodiments, the configuration signal toggles and does not stabilize if overcurrent is present in the hybrid driver.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a driver circuit; and
   diagnostic circuitry coupled to the driver circuit and including on-state diagnostic circuitry configured to detect an over current condition in an active operating mode of the driver circuit and off-state diagnostic circuitry configured to detect an open load fault in an inactive operating mode of the driver circuit, wherein the diagnostic circuitry is configured to:
   generate a configuration signal associated with an operative condition of the driver circuit based on a comparator output of the off-state diagnostic circuitry;
   diagnose conditions associated with the driver circuit; and
   control operation of the on-state diagnostic circuitry based on the configuration signal.

2. The device of claim 1, wherein operation of the off-state diagnostic circuitry is based on the configuration signal.

3. The device of claim 1, wherein the off-state diagnostic circuitry, in operation, detects a short fault of the driver circuit.

4. The device of claim 1, wherein the diagnostic circuitry determines the configuration signal in a fail-safe mode of the device.

5. The device of claim 4, wherein the fail-safe mode is entered directly from a sleep mode or reset mode.

6. The device of claim 1, wherein:
   the comparator output is an inverted output of a comparator of the off-state diagnostic circuitry; and
   a non-inverted output of the comparator is used to indicate an open load fault, a short fault, or both of the driver circuit.

7. The device of claim 1, wherein:
   the off-state diagnostic circuitry includes a plurality of first switches;
   the on-state diagnostic circuitry includes a plurality of second switches; and
   the device includes combinatorial logic coupled to the plurality of first switches and the plurality of second switches, wherein the combinatorial logic, in operation:
   receives the configuration signal from the off-state diagnostic circuitry; and
   controls open and closed states of the plurality of first switches and open and closed states of the plurality of second switches based on the configuration signal.

8. The device of claim 1, wherein the off-state diagnostic circuitry includes:
   a comparator;
   a first current source coupled to a first input of the comparator,
   a second current source coupled to the first input of the comparator; and
   an inverter coupled to an output of the comparator.

9. A system comprising:
   a microcontroller unit;
   a system basis chip; and
   a device coupled to the microcontroller unit and the system basis chip, the device including:
   a driver circuit; and
   diagnostic circuitry including on-state diagnostic circuitry configured to detect an over current condition in an active operating mode of the driver circuit and off-state diagnostic circuitry configured to detect an open load fault in an inactive operating mode of the driver circuit, wherein the diagnostic circuitry is configured to:
   generate a configuration signal associated with an operative condition of the driver circuit based on a comparator output of the off-state diagnostic circuitry;
   diagnose conditions associated with the driver circuit; and
   control operation of the on-state diagnostic circuitry based on the configuration signal.

10. The system of claim 9, wherein the diagnostic circuitry generates the configuration signal in a fail-safe mode.

11. The system of claim 10, wherein the fail-safe mode is associated with failure of the microcontroller unit.

12. A method, comprising:
   generating a configuration signal associated with an operative condition of a driver circuit based on a comparator output of off-state diagnostic circuitry, the off-state diagnostic circuitry being coupled to the driver circuit;

diagnosing conditions associated with the driver circuit; and controlling operation of on-state diagnostic circuitry coupled to the driver circuit, the controlling being based on the configuration signal, wherein the generating a configuration signal includes alternately comparing a reference voltage with a source terminal voltage of the hybrid driver and a drain terminal voltage of the hybrid driver.

13. The method of claim 12, wherein the generating a configuration signal includes determining the hybrid driver is high-side configured when the comparator output settles following the source terminal voltage exceeding the reference voltage.

14. The method of claim 12, wherein the generating a configuration signal includes determining the hybrid driver is low-side configured when the comparator output settles following the drain terminal voltage falling below the reference voltage.

15. The method of claim 12, wherein the alternately comparing results in toggling of the configuration signal, and the toggling is rejected by a digital filter.

16. The method of claim 12, comprising:
the hybrid driver entering a fail-safe mode from a sleep mode.

17. The method of claim 16, wherein the configuration signal stabilizes before the hybrid driver enters an active mode from the fail-safe mode.

18. The method of claim 16, wherein the configuration signal toggles and does not stabilize if overcurrent is present in the hybrid driver.

19. The device of claim 9, wherein:
the comparator output is an inverted output of a comparator of the off-state diagnostic circuitry; and
a non-inverted output of the comparator is used to indicate an open load fault, a short fault, or both of the driver circuit.

20. The device of claim 9, wherein:
the off-state diagnostic circuitry includes a plurality of first switches;
the on-state diagnostic circuitry includes a plurality of second switches; and
the device includes combinatorial logic coupled to the plurality of first switches and the plurality of second switches, wherein the combinatorial logic, in operation:
receives the configuration signal from the off-state diagnostic circuitry; and
controls open and closed states of the plurality of first switches and open and closed states of the plurality of second switches based on the configuration signal.

* * * * *